United States Patent
Hayashi

(10) Patent No.: US 11,398,828 B2
(45) Date of Patent: Jul. 26, 2022

(54) ANALOG-TO-DIGITAL CONVERTER

(71) Applicant: SANKEN ELECTRIC CO., LTD., Niiza (JP)

(72) Inventor: Hideki Hayashi, Niiza (JP)

(73) Assignee: SANKEN ELECTRIC CO., LTD., Niiza (JP)

( * ) Notice: Subject to any disclaimer, the term of this patent is extended or adjusted under 35 U.S.C. 154(b) by 0 days.

(21) Appl. No.: 17/209,997

(22) Filed: Mar. 23, 2021

(65) Prior Publication Data
US 2021/0211136 A1    Jul. 8, 2021

Related U.S. Application Data

(63) Continuation of application No. PCT/JP2018/035248, filed on Sep. 25, 2018.

(51) Int. Cl.
*H03M 1/20* (2006.01)
*H03M 1/36* (2006.01)
*H03M 1/42* (2006.01)

(52) U.S. Cl.
CPC ............. *H03M 1/20* (2013.01); *H03M 1/362* (2013.01); *H03M 1/42* (2013.01)

(58) Field of Classification Search
CPC ............ H03M 1/18; H03M 1/12; H03M 1/20; H03M 1/10; H03M 1/36
See application file for complete search history.

(56) References Cited

U.S. PATENT DOCUMENTS 4,200,371 A * 4/1980 Suzuki ............... G03B 7/00
                                                         396/503
6,268,817 B1 * 7/2001 Min ................... H03M 1/682
                                                         341/145

(Continued)

FOREIGN PATENT DOCUMENTS

JP   S48-42666 A   6/1973
JP   S51-39825 B2  10/1976

(Continued)

OTHER PUBLICATIONS

International Search Report of PCT/JP2018/035248 dated Nov. 27, 2018.

*Primary Examiner* — Lam T Mai
(74) *Attorney, Agent, or Firm* — Metrolex IP Law Group, PLLC

(57) ABSTRACT

An analog-to-digital converter that converts an inputted analog signal into a digital value is disclosed that may include unit circuits that each generate reference voltages comprising regular potential intervals by a series resistor circuit connected between a high potential side reference voltage and a low potential side reference voltage and convert the reference voltages into a digital value by comparing the reference voltages with the inputted analog signal, and an adder that adds the digital values converted by the unit circuits. Each unit circuit may include coupling switches that couple the series resistor circuit with the series resistor circuit of another one of the unit circuits and connect the series resistor circuits between the high potential side reference voltage and the low potential side reference voltage and a sharing switch that shares the inputted analog signal with the other unit circuit that is coupled with the series resistor circuit.

6 Claims, 4 Drawing Sheets

(56) References Cited

U.S. PATENT DOCUMENTS

| | | | |
|---|---|---|---|
| 2011/0090106 A1* | 4/2011 | Huang | H03M 1/682 |
| | | | 341/145 |
| 2011/0140941 A1* | 6/2011 | Tsuji | H03F 3/45475 |
| | | | 341/144 |
| 2020/0005650 A1* | 1/2020 | Park | B64C 39/024 |
| 2020/0145581 A1* | 5/2020 | Shimauchi | H04N 5/23229 |

FOREIGN PATENT DOCUMENTS

| | | |
|---|---|---|
| JP | S60-146528 A | 8/1985 |
| JP | S61-186025 A | 8/1986 |
| JP | S63-33013 A | 2/1988 |
| JP | H01-174014 A | 7/1989 |
| JP | H03-79128 A | 4/1991 |
| JP | H06-97827 A | 4/1994 |
| JP | H07-326970 A | 12/1995 |

\* cited by examiner

ANALOG-TO-DIGITAL CONVERTER

CROSS REFERENCE TO RELATED APPLICATIONS

This application is a continuation application of International Application No. PCT/JP2018/035248, filed on Sep. 25, 2018, the entire contents of which are incorporated herein by reference.

BACKGROUND

The disclosure relates to an analog-to-digital converter that converts an inputted analog signal into a digital value.

There has been utilized a flash analog-to-digital converter (hereinafter, called AD converter) that includes potential comparators (hereinafter, called comparators), a comparing voltage generator including voltage-dividing resistors connected in series to generate comparing voltages of the number of the comparators, and an encoder circuit that converts output results from the comparators into digital values.

Regarding such an AD converter, Japanese Patent Application Publication Nos. S61-186025 (PTL 1) and H07-326970 (PTL 2) disclose techniques that make it possible to change the resolution by adding a switch in a comparing potential generator, for example. An object of PTL 1 is to make it possible to change the resolution of the AD converter depending on the situation, and an object of PTL 2 is to facilitate testing by utilizing the changing of the resolution.

However, although it is possible to change the resolution for a single analog signal in the related techniques, if there is a need for conversion of multiple analog signals into digital values rather than achieving high resolution, the same number of AD converters as that of the analog signals to be converted are required. For this reason, in order to satisfy both the needs for the AD conversion at a high resolution and the AD conversion at a low resolution for multiple analog signals, a number of AD converters that may perform the AD conversion at a high resolution have to be provided, which brings about a large layout area and high cost. Targeting only one of these needs leads to poor versatility.

SUMMARY

An analog-to-digital converter that converts an inputted analog signal into a digital value according to one or more embodiments may include: unit circuits that each generate reference voltages comprising regular potential intervals by a series resistor circuit connected between a high potential side reference voltage and a low potential side reference voltage and convert the reference voltages into a digital value by comparing the reference voltages with the inputted analog signal; and an adder that adds the digital values converted by the unit circuits. Each unit circuit may include coupling switches that couple the series resistor circuit with the series resistor circuit of another one of the unit circuits and connect the series resistor circuits between the high potential side reference voltage and the low potential side reference voltage and a sharing switch that shares the inputted analog signal with the other unit circuit that is coupled with the series resistor circuit.

DETAILED DESCRIPTION

Figure 1:
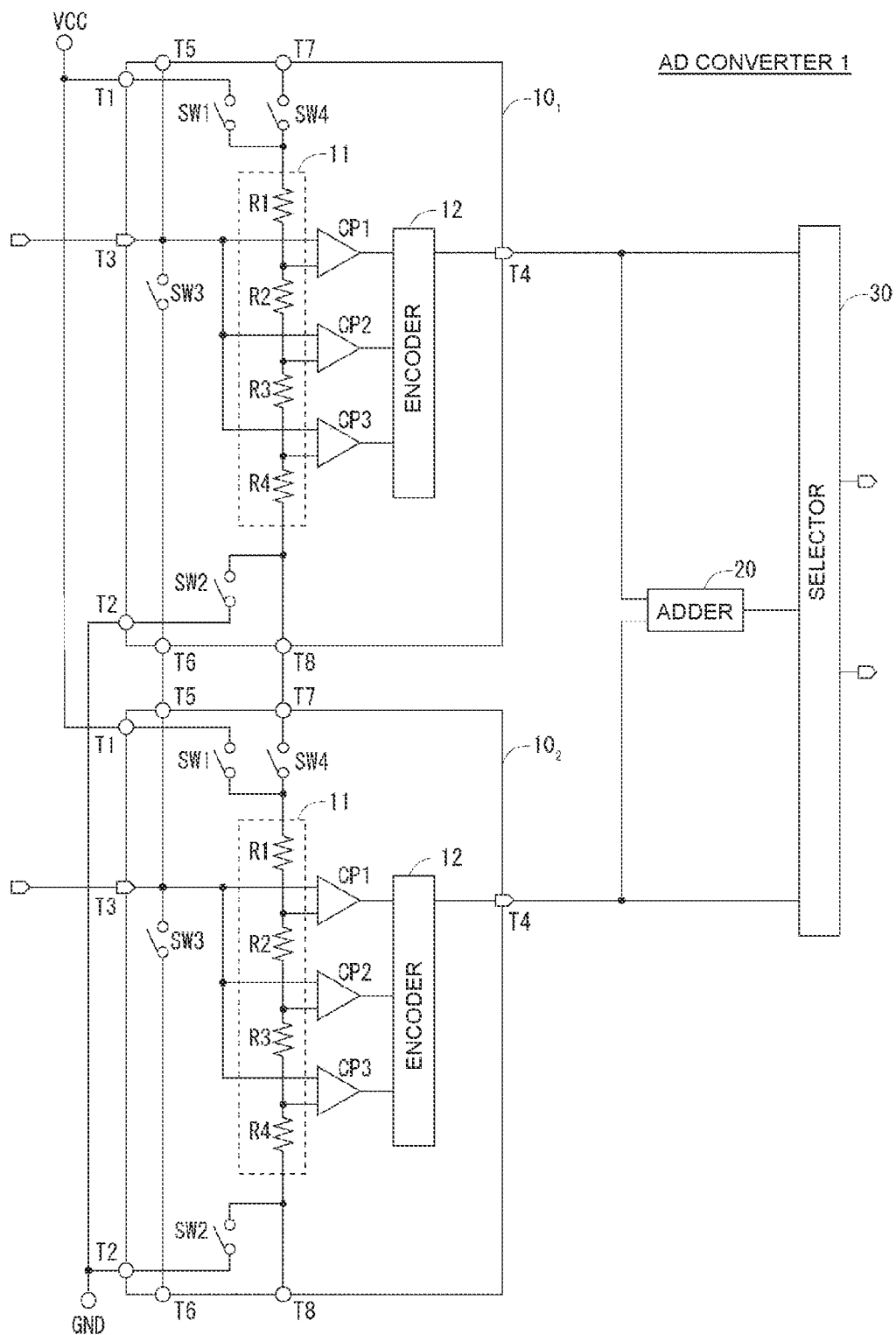
FIG. 1 is a configuration diagram illustrating an analog-to-digital converter according to one or more embodiments.

An analog-to-digital converter according to one or more embodiments is described in detail with reference to the drawings. In the following embodiments, the configurations indicating similar functions are marked with the same reference numerals, and redundant descriptions thereof are omitted.

FIG. 1 is a configuration diagram illustrating an AD converter 1 according to one or more embodiments. As illustrated in FIG. 1, the AD converter 1 includes two unit circuits $10_1$ and $10_2$, an adder 20, and a selector 30. The two unit circuits $10_1$ and $10_2$ may have the same configurations; thus, they are described as a unit circuit 10. In one or more embodiments, the term "unit circuit" may refer to an analog-to-digital converter that includes at least one comparator to compare an inputted analog value with a reference voltage input value, convert the comparison result into a digitally converted value of 0 or 1 according to the magnitude relationship of the voltages, and output the digitally converted value.

The unit circuit 10 includes a series resistor circuit 11 that generates three reference voltages having regular potential intervals, three comparators CP1 to CP3 that compare an inputted analog signal with each of the three reference voltages, and an encoder 12 that converts the comparison results from the comparators CP1 to CP3 into a digital value of two bits.

The series resistor circuit 11 includes resistors R1 to R4 connected in series, and an open end of the resistor R1 is a high potential side terminal while an open end of the resistor R4 is a low potential side terminal. The resistors R2 and R3 have the same resistance values. Thus, when a voltage is applied between the high potential side terminal and the low potential side terminal, potentials of nodes on the low potential sides of the resistors R1 to R3 are inputted to inverting input terminals of the comparators CP1 to CP3, respectively, as the three reference voltages having regular potential intervals.

The sum of a resistance value of the resistor R1 and a resistance value of the resistor R4 is set to be the same as each resistance value of the resistors R2 and R3. When the resistance value of the resistor R1 is set to be the same as the resistance value of the resistor R2 or R3, the resistor R4 may be omitted. When the resistance value of the resistor R4 is set to be the same as the resistance value of the resistor R2 or R3, the resistor R1 may be omitted.

The comparators CP1 to CP3 compare the inputted analog signal with each of the three reference voltages generated by the series resistor circuit 11. When the analog signal is greater than the reference voltage, an output of the corresponding one of the comparators CP1 to CP3 becomes a high level signal. When the analog signal is smaller than the reference voltage, an output of the corresponding one of the comparators CP1 to CP3 becomes a low level signal.

The encoder 12 converts the outputs from the comparators CP1 to CP3, or the number of the high level signals outputted from the comparators CP1 to CP3, into a digital value of two bits.

The unit circuit 10 includes a first terminal T1, a second terminal T2, a third terminal T3, a fourth terminal T4, a fifth terminal T5, a sixth terminal T6, a seventh terminal T7, an eighth terminal T8, a first switch SW1, a second switch SW2, a third switch SW3, and a fourth switch SW4.

The first terminal T1 is a high potential input terminal that is connected with a high potential side reference voltage VCC. The first terminal T1 is connected to the high potential side terminal of the series resistor circuit 11 through the first switch SW1.

The second terminal T2 is a low potential input terminal that is connected with a low potential side reference voltage GND. The second terminal T2 is connected to the low potential side terminal of the series resistor circuit 11 through the second switch SW2.

The third terminal T3 is a terminal to which the analog signal is inputted and is connected to non-inverting input terminals of the comparators CP1 to CP3.

The fourth terminal T4 is connected to an output terminal of the encoder 12 and is a terminal to which the digital value of two bits converted by the encoder 12 is outputted.

The fifth terminal T5 is a high potential side analog signal sharing terminal that shares the analog signal with a unit circuit 10 on the high potential side. The sixth terminal T6 is a low potential side analog signal sharing terminal that shares the analog signal with a unit circuit 10 on the low potential side. The fifth terminal T5 is connected to the non-inverting input terminals of the comparators CP1 to CP3, and the sixth terminal T6 is connected to the non-inverting input terminals of the comparators CP1 to CP3 through the third switch SW3. The fifth terminal T5 and the non-inverting input terminals of the comparators CP1 to CP3 may be connected with each other through the third switch SW3.

The seventh terminal T7 is a terminal that is connected with the eighth terminal T8 of another unit circuit 10 arranged on the high potential side and is connected to the high potential side terminal of the series resistor circuit 11 through the fourth switch SW4. In the unit circuit $10_1$ that is arranged to be closest to the high potential side, the seventh terminal T7, the fourth switch SW4 and the first switch SW1 may be omitted, and the high potential side terminal of the series resistor circuit 11 and the first terminal T1 may be connected with each other directly.

The eighth terminal T8 is a terminal that is connected with the seventh terminal T7 of another unit circuit 10 arranged on the low potential side and is connected to the low potential side terminal of the series resistor circuit 11. In the unit circuit $10_2$ that is arranged to be closest to the lowest potential side, the eighth terminal T8 and the second switch SW2 may be omitted, and the low potential side terminal of the series resistor circuit 11 and the second terminal T2 may be connected with each other directly.

The fourth switch SW4 may be connected between the eighth terminal T8 and the low potential side terminal of the series resistor circuit 11.

On and off of the first switch SW1 to the fourth switch SW4 are switched statically or dynamically by a control device such as a microcomputer. For example, it may be possible to control on and off of the first switch SW1 to the fourth switch SW4 by a rewritable flag register.

The adder 20 adds the digital value of two bits outputted by the fourth terminal T4 of the unit circuit $10_1$ to the digital value of two bits of the fourth terminal T4 of the unit circuit $10_2$ and outputs a digital value of three bits.

The selector 30 includes three input terminals to which the digital values of two bits outputted from the fourth terminal T4 of the unit circuit $10_1$ and the fourth terminal T4 of the unit circuit $10_2$ and the digital value of three bits outputted from the adder 20 are inputted, and two output terminals. The selector 30 arbitrarily selects the input signals inputted from the three input terminals and outputs the input signal from the corresponding one of the two output terminals by a control circuit such as a microcomputer.

Figure 2:
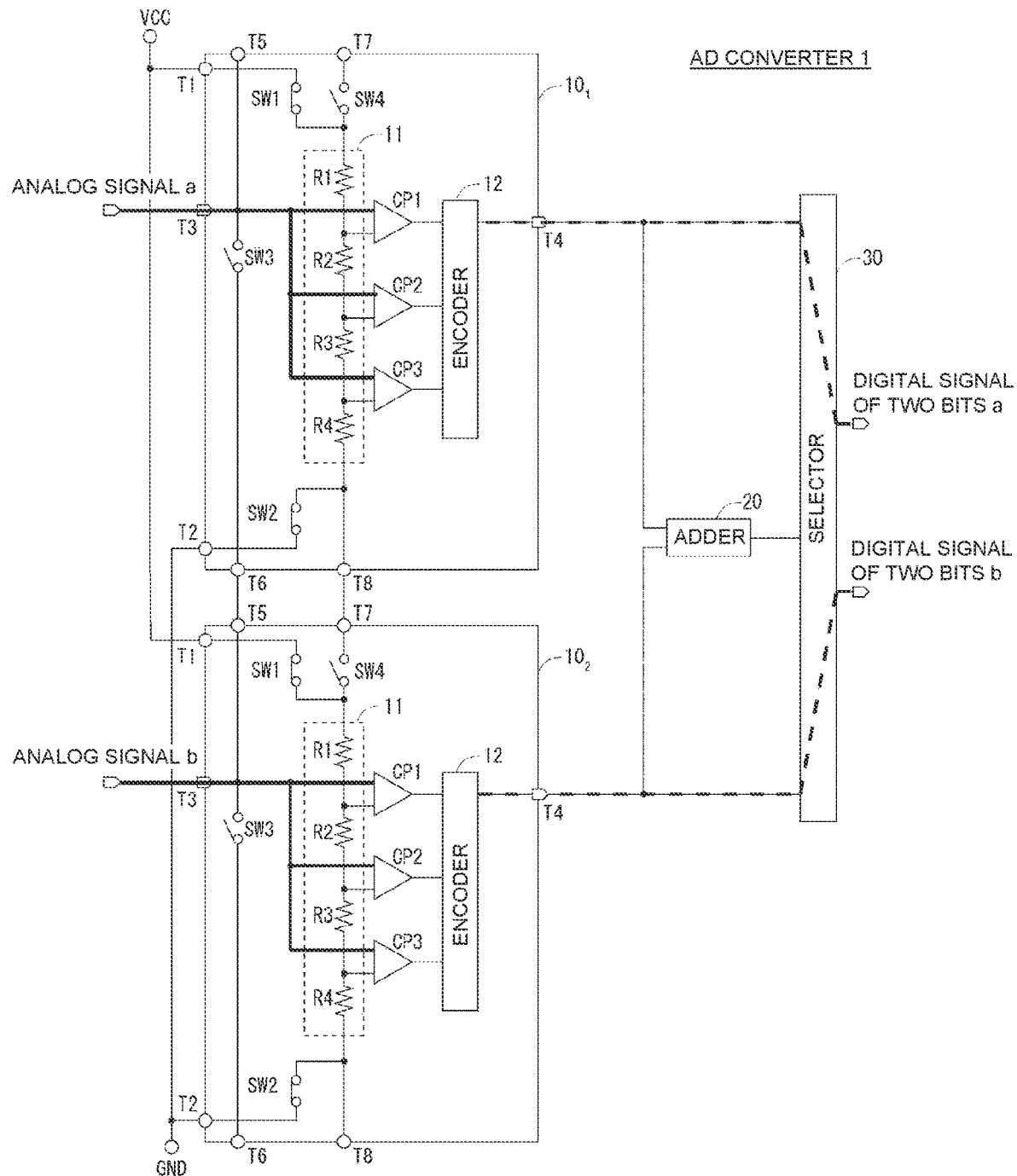
FIG. 2 is an explanatory diagram illustrating a first usage example of an analog-to-digital converter, such as that illustrated in FIG. 1.

The AD converter 1 may function the unit circuits $10_1$ and $10_2$ as individual AD converters of resolution of two bits by turning on the first switches SW1 and the second switches SW2 and turning off the third switches SW3 and the fourth switches SW4 in the unit circuits $10_1$ and $10_2$ as illustrated in FIG. 2. The fourth switch SW4 in the unit circuit $10_1$ and the third switch SW3 in the unit circuit $10_2$ may be turned on.

Specifically, with the first switch SW1 and the second switch SW2 being turned on and the fourth switch SW4 being turned off, the high potential side terminals of the series resistor circuits 11 of the unit circuits $10_1$ and $10_2$ are connected to the high potential side reference voltage VCC, while the low potential side terminals of the series resistor circuits 11 of the unit circuits $10_1$ and $10_2$ are connected to the low potential side reference voltage GND. It may be desirable to exclusively control on and off of the pair of the first switch SW1 and the second switch SW2 and the fourth switch SW4 to prevent a short circuit between the high potential side reference voltage VCC and the low potential side reference voltage GND.

With the third switch SW3 being turned off, analog signals a and b inputted to the third terminals T3 of the unit circuits $10_1$ and $10_2$ are converted into the digital values of two bits by the unit circuits $10_1$ and $10_2$ and outputted from the fourth terminals T4, respectively. With the selector 30 selecting and outputting the digital values of two bits outputted from the unit circuits $10_1$ and $10_2$, respectively, it is possible to obtain a digital signal a, which is obtained by AD-converting the analog signal a at a resolution of two bits, and a digital signal b, which is obtained by AD-converting the analog signal b at a resolution of two bits.

Figure 3:
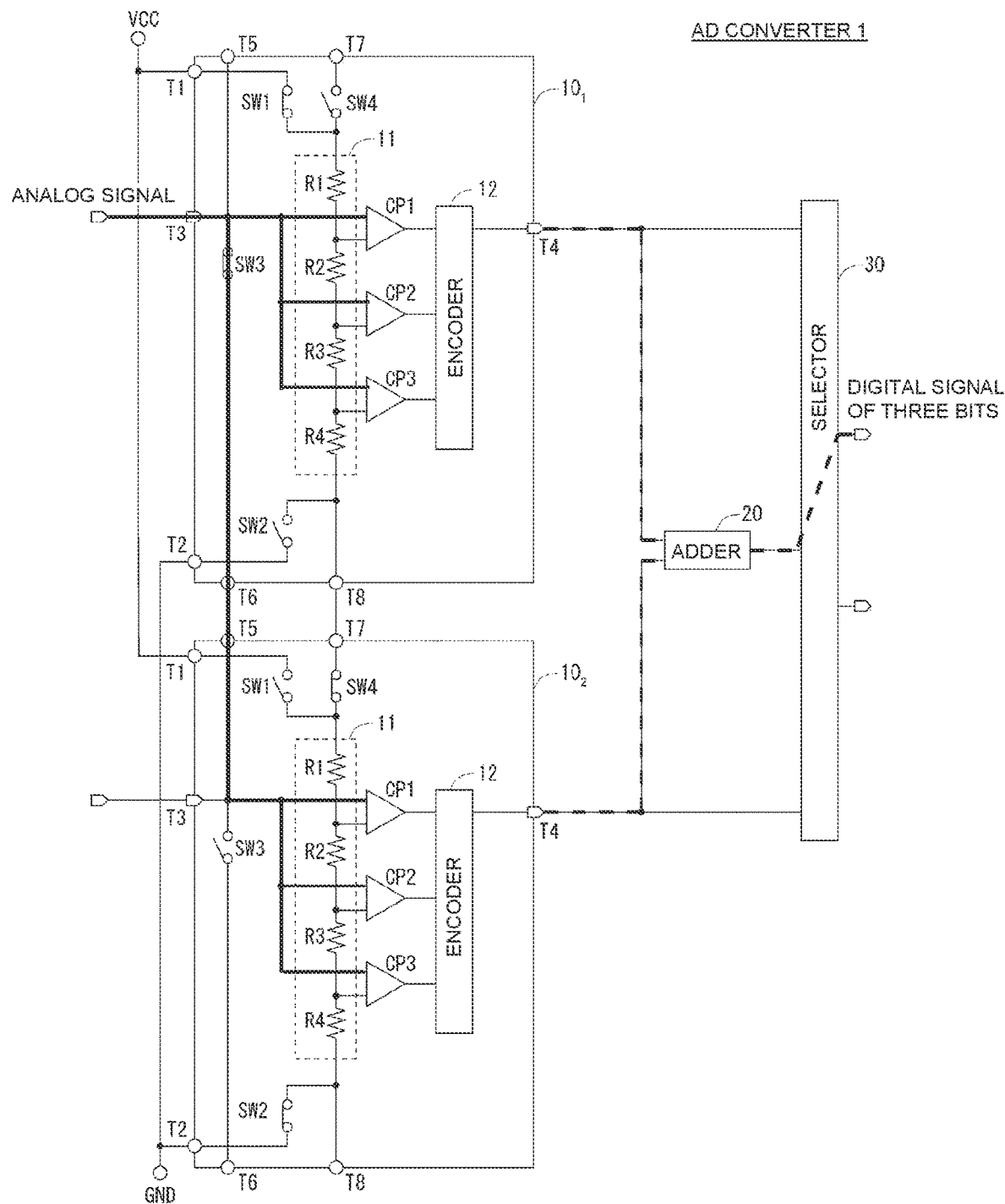
FIG. 3 is an explanatory diagram illustrating a second usage example of an analog-to-digital converter, such as that illustrated in FIG. 1.

The AD converter 1 may couple the unit circuits $10_1$ and $10_2$ with each other and function them as an AD converter of resolution of three bits by turning on the first switch SW1 and the third switch SW3 and turning off the second switch SW2 and the fourth switch SW4 in the unit circuit $10_1$, while turning on the second switch SW2 and the fourth switch SW4 and turning off the first switch SW1 and the third switch SW3 in the unit circuit $10_2$, as illustrated in FIG. 3. The fourth switch SW4 in the unit circuit $10_1$ and the third switch SW3 in the unit circuit $10_2$ may be turned on.

The first switch SW1, the second switch SW2 and the fourth switch SW4 function as coupling switches that couple the series resistor circuit 11 with the series resistor circuit 11 of another unit circuit 10 and connect the series resistor circuits 11 between the high potential side reference voltage VCC and the low potential side reference voltage GND. Specifically, with the fourth switch SW4 of the unit circuit $10_2$ being turned on, the low potential side terminal of the series resistor circuit 11 in the unit circuit $10_1$ and the high potential side terminal of the series resistor circuit 11 in the unit circuit $10_2$ are coupled with each other. With the first switch SW1 being turned on and the second switch SW2 being turned off in the unit circuit $10_1$, and with the first switch SW1 being turned off and the second switch SW2 being turned on in the unit circuit $10_2$, the series resistor circuit 11 in the unit circuit $10_1$ and the series resistor circuit 11 in the unit circuit $10_2$ being coupled with each other are connected between the high potential side reference voltage VCC and the low potential side reference voltage GND. With this configuration, eight reference voltages having regular potential intervals are generated, and three high reference voltages on the high potential side are inputted to the inverting input terminals of the comparators CP1 to CP3 in the unit circuit $10_1$, respectively, while the three low reference voltages on the low potential side are inputted to the inverting input terminals of the comparators CP1 to CP3 in the unit circuit $10_2$, respectively.

The third switch SW3 functions as a sharing switch that shares the inputted analog signal with another unit circuit 10 that is coupled with the series resistor circuit 11. Specifically, with the third switch SW3 of the unit circuit $10_1$ being turned on, the unit circuits $10_1$ and $10_2$ share the analog signal inputted thereto with each other. With this configuration, the analog signal inputted to the third terminal T3 in the unit circuit $10_1$ is converted into a digital value of high two bits by the unit circuit $10_1$ to be outputted from the fourth terminal T4, and also converted into a digital value of low two bits by the unit circuit $10_2$ to be outputted from the fourth terminal T4. Consequently, the adder 20 outputs a digital value of three bits, which is obtained by adding the digital value of high two bits outputted from the unit circuit $10_1$ to the digital value of low two bits outputted from the unit circuit $10_2$. With the selector 30 selecting and outputting the digital value of three bits outputted from the adder 20, it is possible to obtain a digital signal that is obtained by AD-converting an analog signal at a resolution of three bits.

As described above, the AD converter 1 may AD-convert a single analog signal at a resolution of three bits by connecting the two unit circuits $10_1$ and $10_2$ in series. On the other hand, the AD converter 1 also may AD-convert two analog signals at a resolution of two bits by separating the two unit circuits $10_1$ and $10_2$ from each other.

It is possible to set the resolution and the number of the unit circuit 10 as appropriate. When $2^m$ unit circuits 10 of resolution of n bits are provided, it is possible to AD-convert a single analog signal at a resolution of n+m bits by connecting the $2^m$ unit circuits 10 in series. It is possible to AD-convert $2^m$ analog signals at a resolution of n bits by separating the $2^m$ unit circuits 10 from each other. With the number and the combination of the series connection of the $2^m$ unit circuits 10 being set as appropriate, it is possible to easily switch between the setting of AD-converting few analog signals at a high resolution and the setting of AD-converting many analog signals at a low resolution, in a range from the resolution of n+m bits with the highest accuracy to the resolution of n bits with the lowest accuracy.

For example, when four unit circuits 10 of resolution of two bits are provided, it is possible to AD-convert a single analog signal at a resolution of four bits by connecting the four unit circuits 10 in series. It is further possible to AD-convert two analog signals at a resolution of three bits by connecting the unit circuits 10 in series by two. It is still further possible to AD-convert four analog signals at a resolution of two bits by separating the four unit circuit 10 from each other, respectively.

For example, when eight unit circuits 10 of resolution of two bits are provided, it is possible to AD-convert a single analog signal at a resolution of five bits by connecting the eight unit circuits 10 in series. It is further possible to AD-convert two analog signals at a resolution of four bits by connecting the unit circuit 10 in series by four. It is further possible to AD-convert four analog signals at a resolution of three bits by connecting the unit circuits 10 in series by two. It is further possible to AD-convert eight analog signals at a resolution of two bits by separating the eight unit circuits 10 from each other, respectively. It is still further possible to set the number and the combination of the series connection of the eight unit circuits 10 as appropriate. For example, four unit circuits 10 may be connected in series while the other four are separated from each other.

The resolution of the unit circuit 10 is not necessarily in the unit of bit. For example, the unit circuit 10 may be an AD converter that includes four reference potentials and comparators and performs the digital conversion into five states from 0 to 4.

The outputs from the unit circuits 10 connected in series are also not necessarily in the unit of bit. For example, when three AD converters that performs the digital conversion into five states from 0 to 4 are connected in series, the unit circuits 10 are AD converters that include 12 reference potentials and comparators in total and output digital values from 0 to 12 (in decimal number).

Figure 4:
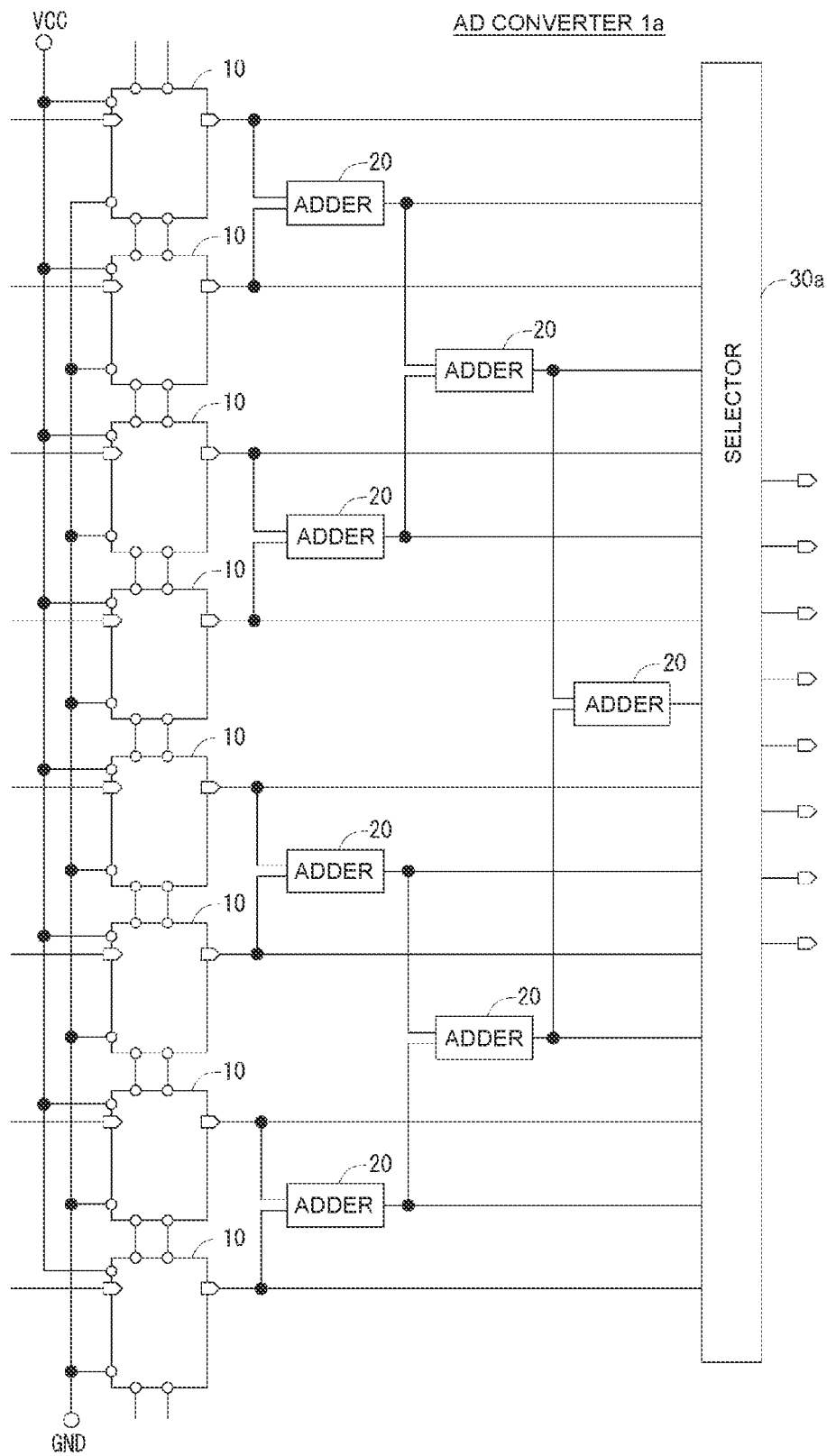
FIG. 4 is a configuration diagram illustrating another configuration example of an analog-to-digital converter according to one or more embodiments.

FIG. 4 is a diagram illustrating an AD converter 1a provided with eight unit circuits 10. When four or more unit circuits 10 are provided, it may be preferable to include multiple adders 20 in the form of binary tree as illustrated in FIG. 4. In this case, the AD converter 1a may be configured such that a selector 30a may arbitrarily select digital values outputted from the four or more unit circuits 10 and digital values outputted from the adders 20. For example, when the resolution of the unit circuit 10 is n, it is possible to output a digital value of resolution of n+1 from the adder 20 in a first row, a digital value of resolution of n+2 from the adder 20 in a second row, and a digital value of resolution of n+3 from the adder 20 in a third row as a final stage, respectively.

As described above, the analog-to-digital converter according to one or more embodiments may be an analog-to-digital converter 1 that converts an inputted analog signal into a digital value and includes: unit circuits 10 that each generate reference voltages having regular potential intervals by a series resistor circuit 11 connected between a high potential side reference voltage VCC and a low potential side reference voltage GND and convert the reference voltages into a digital value by comparing the reference voltages with the inputted analog signal; and an adder 20 that adds the digital values converted by the unit circuits 10, in which each unit circuit 10 includes a first switch SW1, a second switch SW2 and a fourth switch SW4 that function as coupling switches that couple the series resistor circuit 11 with the series resistor circuit 11 of another one of the unit circuits 10 and connect the series resistor circuits 11 between the high potential side reference voltage VCC and the low potential side reference voltage GND, and a third switch SW3 that functions as a sharing switch that shares the inputted analog signal with the other unit circuit 10 that is coupled with the series resistor circuit 11.

According to the above described configuration, since it is possible to switch between the series connection and the separation of the unit circuits 10 of low resolution by the coupling switches and the sharing switch, both the needs for the AD conversion at high resolution and the AD conversion at low resolution for multiple analog signals may be satisfied, and thus it is possible to provide a versatile microcomputer. For example, an analog-to-digital converter mounted in a microcomputer and the like may have either needs for requiring high accuracy rather than the number of AD conversion and requiring the number of AD conversion rather than high accuracy, depending on the intended use.

In one or more embodiments, the analog-to-digital converter further includes: $2^m$ pieces of the unit circuits 10 that each generate ($2^n-1$) pieces of the reference voltages having regular potential intervals by the series resistor circuit 11 and convert the reference voltages into a digital value of n bits by comparing the reference voltages with the inputted analog signal; and the adder 20 that adds the digital values of n bits converted by the $2^m$ unit circuits 10 and outputs a digital value of (n+m) bits.

According to the above described configuration, with the number and the combination of the series connection of the $2^m$ unit circuits 10 being set as appropriate, it is possible to easily switch between the setting of AD-converting few analog signals at a high resolution and the setting of AD-converting many analog signals at a low resolution, in a range from the resolution of n+m bits with the highest accuracy to the resolution of n bits with the lowest accuracy.

In one or more embodiments, the coupling switches (the first switch SW1, the second switch SW and the fourth switch SW4) couple m pieces of the series resistor circuits 11 with each other and generate ($2^n-1$)×m pieces of the reference voltages having regular potential intervals between the high potential side reference voltage VCC and the low potential side reference voltage GND.

According to the above described configuration, with the series resistor circuits 11 being coupled with each other, it is possible to implement the AD conversion at a resolution of high accuracy.

In one or more embodiments, the analog-to-digital converter further includes a selector 30 that arbitrarily selects the digital values outputted from the $2^m$ unit circuits 10 and the digital value outputted from the adder 20 and outputs the digital value from the corresponding one of output terminals.

According to the above described configuration, it is possible to select the digital value to be outputted as appropriate.

In one or more embodiments, when m is two or greater, a plurality of the adders 20 are provided in the form of binary tree, and the selector 30 arbitrarily selects the digital values outputted from the $2^m$ unit circuits 10 and the digital values outputted from the adders 20 and outputs the digital value from the corresponding one of the output terminals.

According to the above described configuration, it may be possible to set the resolution of the digital value to be outputted as appropriate.

One or more embodiments are described above, and are merely examples that may be changed and implemented without departing from the intent of the invention.

According to the analog-to-digital converter of one or more embodiments, the coupling switches and the sharing switch may enable the switching between the series connection and the separation of the unit circuits of low resolution, and thus both the needs for the AD conversion at high resolution and the AD conversion at low resolution for multiple analog signals may be satisfied, and accordingly high versatility may be achieved.

The invention claimed is:

1. An analog-to-digital converter that converts an inputted analog signal into a digital value, comprising:
   unit circuits that each generate reference voltages comprising regular potential intervals by a series resistor circuit connected between a high potential side reference voltage and a low potential side reference voltage and convert the reference voltages into a digital value by comparing the reference voltages with the inputted analog signal; and
   an adder that adds the digital values converted by the unit circuits, wherein:
   each of the unit circuits comprises
      coupling switches that couple the series resistor circuit with the series resistor circuit of another one of the unit circuits and connect the series resistor circuits between the high potential side reference voltage and the low potential side reference voltage, and
   a sharing switch that shares the inputted analog signal with the other unit circuit that is coupled with the series resistor circuit, wherein
      the unit circuits of the analog-to-digital converter comprise $2^m$ unit circuits that each generate ($2^n-1$) reference voltages comprising regular potential intervals by the series resistor circuit and convert the reference voltages into a digital value of n bits by comparing the reference voltages with the inputted analog signal, and
      the adder adds the digital values of n bits converted by the $2^m$ unit circuits and outputs a digital value of (n+m) bits.

2. The analog-to-digital converter according to claim 1, wherein
   the coupling switches couple m series resistor circuits with each other and generate ($2^n-1$)×m reference voltages having regular potential intervals between the high potential side reference voltage and the low potential side reference voltage.

3. The analog-to-digital converter according to claim 1, further comprising:
   a selector that arbitrarily selects the digital values outputted from the $2^m$ unit circuits and the digital value outputted from the adder and outputs the digital value from a corresponding one of output terminals.

4. The analog-to-digital converter according to claim 3, wherein
   m comprises an integer value 2 or greater,
   a plurality of the adders are provided in a form of binary tree, and
   the selector arbitrarily selects the digital values outputted from the $2^m$ unit circuits and the digital values outputted from the adders and outputs the digital value from a corresponding one of the output terminals.

5. An analog-to-digital converter that converts an inputted analog signal into a digital value, comprising:
   unit circuits that each generate reference voltages comprising regular potential intervals by a series resistor circuit connected between a high potential side reference voltage and a low potential side reference voltage and convert the reference voltages into a digital value by comparing the reference voltages with the inputted analog signal;
   an adder that adds the digital values converted by the unit circuits; and
   a selector that arbitrarily selects the digital values outputted from the $2^m$ unit circuits and the digital value outputted from the adder and outputs the digital value from a corresponding one of output terminals, wherein:
   each of the unit circuits comprises
      coupling switches that couple the series resistor circuit with the series resistor circuit of another one of the unit circuits and connect the series resistor circuits between the high potential side reference voltage and the low potential side reference voltage, and
      a sharing switch that shares the inputted analog signal with the other unit circuit that is coupled with the series resistor circuit;

the unit circuits of the analog-to-digital converter comprise $2^m$ unit circuits that each generate $(2^n-1)$ reference voltages comprising regular potential intervals by the series resistor circuit and convert the reference voltages into a digital value of n bits by comparing the reference voltages with the inputted analog signal; and the adder adds the digital values of n bits converted by the $2^m$ unit circuits and outputs a digital value of (n+m) bits.

6. An analog-to-digital converter that converts an inputted analog signal into a digital value, comprising:

unit circuits that each generate reference voltages comprising regular potential intervals by a series resistor circuit connected between a high potential side reference voltage and a low potential side reference voltage and convert the reference voltages into a digital value by comparing the reference voltages with the inputted analog signal;

an adder that adds the digital values converted by the unit circuits; and a selector that arbitrarily selects the digital values outputted from the $2^m$ unit circuits and the digital value outputted from the adder and outputs the digital value from a corresponding one of output terminals, wherein:

each of the unit circuits comprises coupling switches that couple the series resistor circuit with the series resistor circuit of another one of the unit circuits and connect the series resistor circuits between the high potential side reference voltage and the low potential side reference voltage, and a sharing switch that shares the inputted analog signal with the other unit circuit that is coupled with the series resistor circuit;

the unit circuits of the analog-to-digital converter comprise $2^m$ unit circuits that each generate $(2^n-1)$ reference voltages comprising regular potential intervals by the series resistor circuit and convert the reference voltages into a digital value of n bits by comparing the reference voltages with the inputted analog signal;

the adder adds the digital values of n bits converted by the $2^m$ unit circuits and outputs a digital value of (n+m) bits;

m comprises an integer value 2 or greater;

a plurality of the adders are provided in a form of binary tree; and the selector arbitrarily selects the digital values outputted from the $2^m$ unit circuits and the digital values outputted from the adders and outputs the digital value from a corresponding one of the output terminals.

* * * * *